United States Patent [19]

Moncrieff

[11] Patent Number: 5,704,120

[45] Date of Patent: Jan. 6, 1998

[54] NONUNIFORM ELECTRICAL CONNECTION TO CONDUCTIVE SURFACE

[76] Inventor: J. Peter Moncrieff, 408 Mason Rd., Vista, Calif. 92084

[21] Appl. No.: 503,097

[22] Filed: Jul. 17, 1995

[51] Int. Cl.⁶ .................................................. H01R 43/00
[52] U.S. Cl. .................... 29/884; 29/876; 29/832; 29/842
[58] Field of Search ............... 439/91, 591; 264/131; 29/25.41, 832, 874, 842–843, 884, 876; 361/303, 305, 306.1; 174/35 R, 35 MS

[56] References Cited

U.S. PATENT DOCUMENTS

| | | |
|---|---|---|
| 4,737,112 | 4/1988 | Jin et al. ................................ 439/66 |
| 5,041,183 | 8/1991 | Nakamura et al. ..................... 156/264 |
| 5,049,085 | 9/1991 | Reylek et al. ............................ 439/91 |

Primary Examiner—Bot L. Ledynh

[57] ABSTRACT

A method for making electrical connection to an electrically conductive surface, providing improved electrical performance. The electrical connection is made across an extent of the surface, rather than at just one point of the surface, and furthermore is made to be substantially nonuniform along its extent. This nonuniformity can be structured to provide preferential admittance at plural apertures, with these apertures having suitable dimensions and spacings. By this method, improved electrical performance can be provided, compared to prior art methods that connect substantially at one point, or that connect substantially uniformly along an extent.

16 Claims, 2 Drawing Sheets

5,704,120

1

NONUNIFORM ELECTRICAL CONNECTION TO CONDUCTIVE SURFACE

FIELD OF INVENTION

This invention pertains to structures for making electrical connection to electrically conductive surfaces.

BACKGROUND OF THE INVENTION

An electrically conductive surface can be a useful element, for example as a shield or as a ground plane or as a capacitor electrode or plate. When making an electrical connection to a conductive surface, prior art has made this connection either substantially at just one point, or extending substantially over one entire dimension of that surface but uniformly with respect to that dimension. For example, electrical contact with a capacitor plate has been made either at substantially one point of that plate, or it has been made to extend substantially over one entire edge of that plate but uniformly with respect to that entire edge.

It has now been experimentally determined and demonstrated that it can be advantageous to make an electrical connection to a conductive surface that extends a substantial portion over a dimension of that conductive surface, but which is nonuniform with respect to that dimension.

DESCRIPTION OF PRIOR ART

Prior art has commonly connected a conductive surface at substantially just one point. FIG. 1 shows an example of such prior art, in plan view. A conductive surface 1 is electrically connected to a single terminal 5 at substantially just one point, point 18. Additionally, the connecting structure connecting conductive surface 1 to terminal 5 does not extend proximately to conductive surface 1, and does not extend a substantial portion of the distance along any dimension of conductive surface 1.

For purposes of discussion, the length and width directions of two dimensions of conductive surface 1 are indicated in the drawings by the letters L and W respectively. For purposes of the present invention, the term "direction" will be used to indicate an axis (straight or curved) in space, without regard to left vs. right or plus vs. minus directions on that axis.

In some prior art structures, terminal 5 might extend in a direction that corresponds to a direction of one of the dimensions of conductive surface 1 (for example, in FIG. 1, terminal 5 might extend in the same direction as width direction W). However, the extent of such prior art terminals is not substantially proximate to conductive surface 1; instead, such prior art terminals extend away from conductive surface 1, and thus still contact conductive surface, at substantially just one point.

In a variation of FIG. 1, some prior art terminals or connecting structures might be substantially perpendicular to conductive surface 1, or perpendicular to a stacked plurality of conductive surfaces or conductive surface layers. As such, they still contact each conductive surface 1 at substantially just one point, and do not extend a substantial portion of the distance along any dimension of any conductive surface 1.

Conductive surface 1 could have any shape and dimensions. If conductive surface 1 were, for example, a plate of a roll capacitor, it could have a length of 2000 inches and a width of 1 inch, as illustrated in FIG. 1.

In FIG. 1, a path 20 and a path 21 are shown by arrows. Paths 20 and 21 could be representative of the many paths

2 taken by electric current and/or by electromagnetic waves propagating from point 18 across conductive surface 1—path 20 representing a short such path and path 21 representing a long such path.

For any capacitor to work, electric charge must get from the terminal to all parts of the electrode plate. If conductive surface 1 were an electrode plate of a capacitor, both paths 20 and 21 would be involved with the filling of this entire plate with electric charge, so that this plate could function as part of a capacitor. Electric current or charge movement generally is driven by or accompanied by an electromagnetic wave following a similar path, so an electromagnetic wave would generally follow both paths 20 and 21 in filling conductive surface 1 with electric charge. If conductive surface 1 were employed as another kind of electrical element, for example as a shield or ground plane, both paths 20 and 21 could still be important to the functioning of conductive surface 1, for example by being paths for electrical draining or equipotential maintenance of conductive surface 1 relative to point 18 and terminal 5.

One problem with this prior art structure is that path 21 can be very long. Thus its self inductance can be disadvantageously high, since self inductance can be proportional to length in a straight line. High self inductance can be disadvantageous in adversely impacting the high frequency electrical performance of conductive surface 1, and/or in making the electrical performance of conductive surface 1 change with respect to frequency. This disadvantageous self inductance could be further multiplied many times if conductive surface 1 were rolled up to form a roll capacitor, since path 21 would then execute a tight solenoid with many coil loop turns, and the inductance of a tightly coiled solenoid can be proportional to the number of coil turns squared.

A second problem with this prior art structure is that the disparity can be very great between the lengths of paths 21 and 20 (about 2000 to 1 as shown in FIG. 1). Thus there can be disadvantageous temporal dispersion or smearing of any electrical change or signal being handled by or associated with conductive surface 1. This temporal dispersion could arise firstly due to the disparity in path length and thus travel time, and secondly due to the disparity in self inductance between paths 21 and 20. A disparity in self inductance between paths 21 and 20 could be disadvantageously temporally dispersive because the high frequency electrical performance of conductive surface 1 would be very different for path 21 than for path 20. This disparity in self inductance between paths 21 and 20 could be proportional to their disparity in length if conductive surface 1 were flat, but this disparity could become even far greater if conductive surface 1 were rolled up to form a roll capacitor, since path 21 would then execute a tight solenoid with many coil loop turns while path 20 would remain substantially straight, and the inductance of a tightly coiled solenoid can be proportional to the number of coil turns squared.

Prior art has also commonly connected a conductive surface over an entire dimension, with this connection being substantially uniform over this entire dimension. FIG. 2 shows an example of such prior art, in plan view. Conductive surface 1 is electrically connected to terminal 5 by a connecting structure 3, which extends substantially the entire dimension of conductive surface 1 in the direction of length L, and which is disposed along one edge of conductive surface 1. In prior art, connecting structure 3 is substantially uniform and contiguous over the entire dimension it extends.

Connecting structure 3 can furnish additional points such as points 19 for an electromagnetic wave to enter conductive surface 1, in addition to point 18. Paths 22 illustrate possible paths that an electromagnetic wave launching at points 19 might follow through conductive surface 1.

The prior art structure of FIG. 2 still has problems, similar to those discussed for the FIG. 1 prior art structure. Paths 20 and 21 still exist for electromagnetic wave propagation, and path 21 is not specifically prevented, weakened, reduced, or discouraged. This still allows the problems of very high inductance for path 21, and great disparity in path length and inductance between paths 21 and 20, all of which engender performance problems for conductive surface 1 in handling high frequencies, and in handling signals without disadvantageous temporal dispersion.

Furthermore, even paths 22 are too long, too high in self inductance, and too temporally dispersive. In the FIG. 2 structure, the electromagnetic wave from terminal 5 can propagate along connecting structure 3, from point 18 towards points 19 and beyond, along a path 17 generally following the dimension of conductive surface 1 in the length L direction. This electromagnetic wave could propagate freely and fast because it could be travelling largely in space along path 17, since connecting structure 3 could be surrounded by open space on all sides except for that small portion where it is joined to conductive surface 1. Some portion of this electromagnetic wave, propagating in space along path 17, would enter conductive surface 1. It would be slowed by entering the denser medium of conductive surface 1, and its path would be angularly bent or refracted. As an analogy, one could envision a ray of light (which is also an electromagnetic wave) travelling in space on path 17 generally along connecting structure 3, and being bent or refracted wherever it entered the denser medium of a liquid or glass corresponding to conductive surface 1, thereupon following paths similar to paths 22.

This bending could produce diagonal paths for the electromagnetic wave through conductive surface 1, such as illustrated by paths 22. Such diagonal paths are, like path 21, longer than ideal, and longer than path 20. Thus, they would have higher self inductance than ideal, and would be disadvantageously dispersive relative to path 20. These problems for paths 22 could become far worse if conductive surface were rolled up to form a plate of a roll capacitor, since the inductance for paths 22 would then be multiplied by the square of the number of coil loop turns their diagonal direction executed in the roll capacitor.

The diagonal angle for various paths 22 might also vary, as illustrated for the two paths 22 shown in FIG. 2. If these diagonal angles vary, this would disadvantageously produce further temporal dispersion, due to the differing path lengths and differing inductances. There could be several reasons why the diagonal angle for various paths 22 might vary along connecting structure 3. For example, the bending or refracting effect upon an electromagnetic wave might change as the launch point 19 gets farther away from terminal 5, or closer toward another terminal of another capacitor plate, or closer toward a ground plane or ground connection, perhaps due to impedance being different at these various distances.

The aforementioned disadvantages of prior art are largely due to the fact that various electromagnetic wave paths through a conductive surface are diagonal, such as paths 21 and 22. This produces paths of significantly unequal length and unequal self inductance (path 20 vs. paths 21 and 22). It also produces paths that are too long, that are not mutually parallel, and that execute too many coil loop turns in the case where the conductive surface is rolled up.

It could be advantageous for the electrical performance of a conductive surface to provide that the various paths across the conductive surface could be made to be more uniform in length, for an electromagnetic wave fed to (or drained from) that surface. For example, more uniform path lengths could provide less temporal smearing of any electrical change or signal, and less dispersion of signals containing plural frequencies. It could be further advantageous to provide that the various paths across the conductive surface could be more parallel to one another, and also could be as short as possible, and also could execute as few coil loop turns as possible in the case where the conductive surface is rolled up. Such paths could have more uniform self inductance, and thus could provide less temporal smearing of any electrical change or signal, and less dispersion of signals containing plural frequencies.

The disadvantageous diagonal paths of prior art structures such as FIG. 2 are largely due to the fact that connecting structure 3 is uniform with respect to the dimension over which it extends. This uniformity produces the bending or refraction of the electromagnetic wave that in turn produces many diagonal paths across the conductive surface.

It could be advantageous for the electrical performance of a conductive surface to provide that a connecting structure be nonuniform with respect to the dimension of the conductive surface over which it extends. Appropriate kinds of nonuniformity could prevent or discourage the bending or refraction that prior art structures allow; could prevent, weaken, reduce, or discourage diagonal paths for electromagnetic waves across a conductive surface; and could thereby prevent or mitigate the problems caused by the diagonal paths of electromagnetic waves in prior art structures. It has been experimentally determined and demonstrated that improved electrical performance of a conductive surface can be provided by employing a connecting structure that is nonuniform with respect to the dimension of the conductive surface over which it extends.

OBJECTS AND ADVANTAGES

Accordingly, it is an object of the present invention to provide a connecting structure and method for making electrical connection to a conductive surface, yielding improved electrical characteristics by being nonuniform over its extent along a dimension of the conductive surface.

A further object of the present invention is to provide a structure and method for controlling paths taken by electromagnetic waves across an electrically conductive surface, and thereby to provide improved electrical performance from the conductive surface.

Further objects and advantages of the present invention will become apparent from a consideration of the drawings and ensuing description of preferred embodiments.

DESCRIPTION OF PREFERRED EMBODIMENTS

Figure 2:
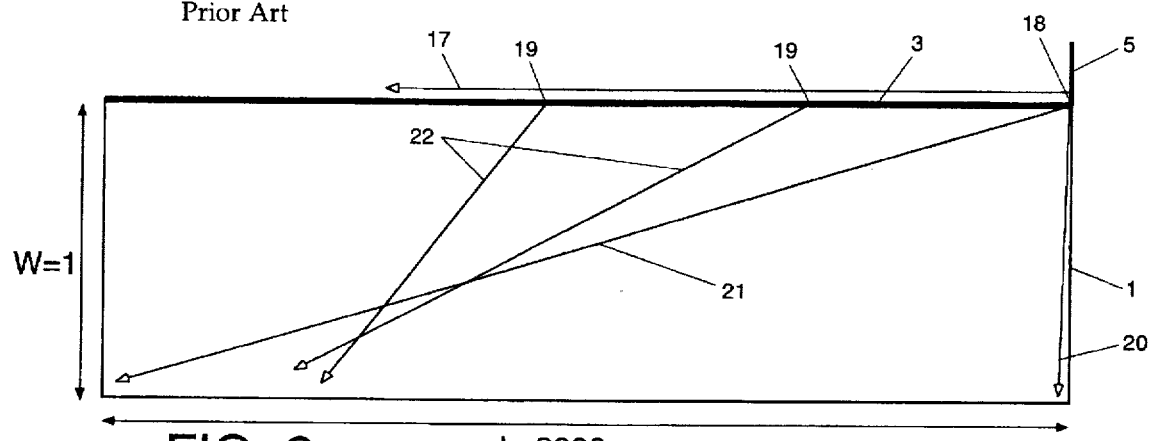
Figure 3:
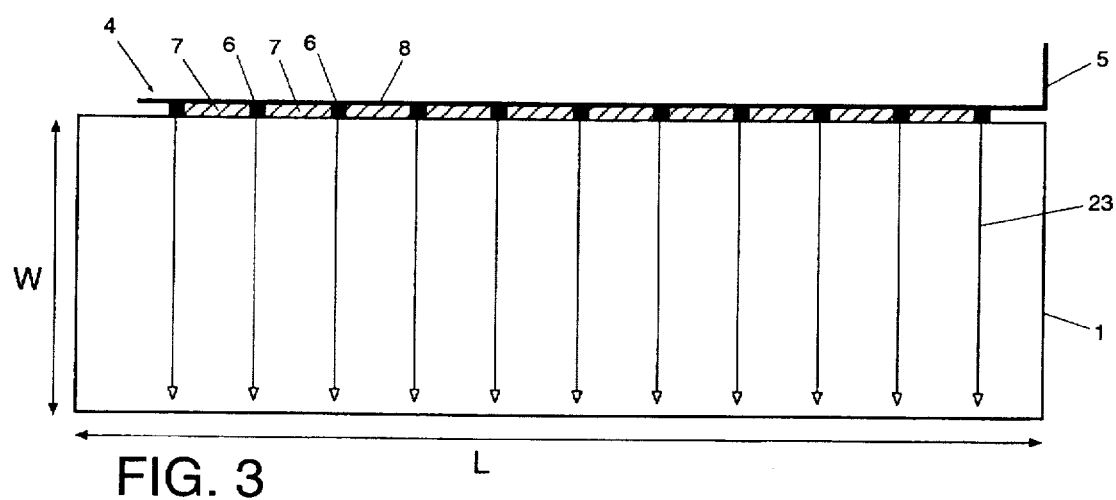
FIGS. 3–6 show embodiments of a connecting structure in accordance with the present invention, in plan view.

FIG. 3 shows one possible embodiment of the present invention, in plan view. As with the prior art structures shown in FIGS. 1–2, terminal 5 is electrically connected to conductive surface 1. But in FIG. 3 the electrical connection between terminal 5 and conductive surface 1 is accomplished by a connecting structure 4.

Connecting structure 4 could be considered to be a substructure of a structure which comprises both conductive surface 1 and the structure for making external electrical connection to conductive surface 1, namely connecting structure 4. Connecting structure 4 in turn could comprise particular substructures or elements, in accordance with the present invention, as will be shown below.

Figure 1:
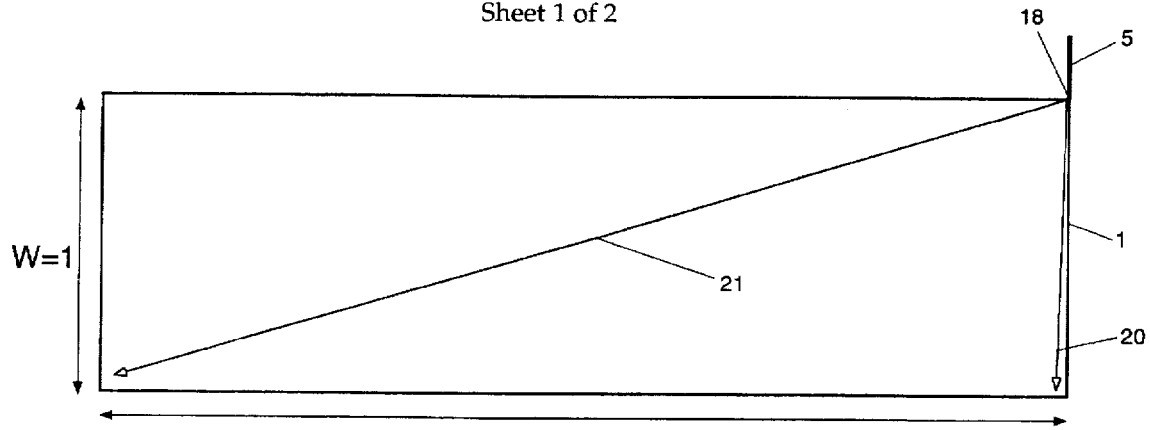
FIGS. 1–2 show embodiments of prior art connecting structures, in plan view.

In contrast to the prior art structure of FIG. 1, connecting structure 4 has the property of extending a substantial portion of distance proximately to conductive surface 1, over at least one dimension of conductive surface 1, a substantial portion of distance being substantially more than just one point.

In contrast to the prior art structure of FIG. 2, connecting structure 4 is nonuniform with respect to at least the predominant dimension of conductive surface 1 over which it extends a substantial distance, and is nonuniform within its extent along the direction of this dimension.

Connecting structure 4 might extend over an entire dimension of conductive surface 1, such as the dimension in length direction L. Alternatively, connecting structure 4 might extend over only a fraction of a dimension of conductive surface 1. In accordance with the present invention, connecting structure 4 is nonuniform, with respect to this dimension, within its extent over this dimension. Connecting structure 4 is nonuniform within its extent, so that, if it does not extend the entire measure of a dimension of conductive surface 1, it still exhibits a nonuniformity within its extent, with respect to at least one dimension of conductive surface 1. Thus, the nonuniformity of connecting structure 4 with respect to a dimension of conductive surface 1 does not arise merely from the fact that it might not extend the entire measure of a dimension of conductive surface 1.

In the FIG. 3 example, connecting structure 4 extends predominantly along the dimension of conductive surface 1 in the length direction L, and thus, in accordance with the present invention, it is nonuniform with respect to at least the dimension of conductive surface 1 in this predominant direction. If connecting structure 4 were instead to extend predominantly along the dimension of conductive surface 1 in the width direction W, then, to be in accordance with the present invention, it would be nonuniform with respect to at least the dimension of conductive surface 1 in this predominant direction.

The extent of connecting structure 4 in its predominant direction (along which it is nonuniform) could be much greater than (for example, more than ten times) its extent in a substantially perpendicular direction that is also parallel to conductive surface 1. Thus, for example, connecting structure 4 might have a significant extent in its predominant direction, along the dimension of conductive surface 1 in the length L direction, while having a very small extent in the perpendicular direction that is still parallel to conductive surface 1, namely in the width W direction. As such, connecting structure 4 might have the general appearance of a narrow or shallow strip (containing nonuniformities along its length, as shown in the various drawings), with only small extent in a perpendicular direction substantially parallel to the conductive surface to which it connects. This is in contrast, for example, to a comb shaped connecting structure wherein the extent of the comb teeth is approximately as great as or greater than the comb backbone, and wherein each tooth is substantially uniform over its extent with respect to the direction of its extent.

Conductive surface 1 in flat form could be considered to be a two dimensional object. It could then be formed into a three dimensional shape, for example by convoluting it, or making it into a cylinder or rolled up spiral. The present invention is characterized by connecting structure 4 extending a substantial distance over at least one of the two dimensions of conductive surface 1 when considered in flat or flattened form, so that a substantial vector component of this extent is in the direction of at least one of these two dimensions, including in the vicinity of points of contact between connecting structure 4 and conductive surface 1. This is in contrast to a connecting structure that might extend only in a direction substantially perpendicular to the two dimensions of conductive surface 1 when considered in flat or flattened form. Such a perpendicularly extending connecting structure would contact conductive surface 1 in flat or flattened form at substantially only one point. If a conductive surface were convoluted into certain three dimensional forms (e.g. a rolled up spiral), then such a perpendicularly extending connecting structure might contact this conductive surface at plural distinct points, but its extent would remain substantially perpendicular to conductive surface 1 at all such points, with no substantial vector component in the direction of either of the two dimensions of the conductive surface in the vicinity of any contact points.

In accordance with the present invention, there could be various kinds of nonuniformity in connecting structure 4. For example, the nonuniformity of connecting structure 4 could be a nonuniformity of material comprising connecting structure 4, and/or a nonuniformity of structural shape or dimension within the extent of connecting structure 4.

One possible embodiment of such a nonuniformity in connecting structure 4 is shown in FIG. 3, as one or more instances of an aperture 6. Apertures 6 are shown in FIG. 3 as being separated from one another by separators 7, and are shown as being electrically connected to one another and to terminal 5 via a bridging element or elements 8. Connecting structure 4 could include apertures 6, and bridging element 8, and in some cases could also include separators 7. In FIG. 3, connecting structure 4 is nonuniform with respect to the dimension of conductive surface 1 in the length direction L, since apertures 6 alternate with separators 7 along this dimension, within the extent of connecting structure 4 along this dimension.

Apertures 6 could be configured so as to provide, individually or in combination, preferential admittance, at certain points or regions, from nonuniform connecting structure 4 into conductive surface 1. Apertures 6 could be configured so as to provide, individually or in combination, preferential admittance for electromagnetic waves, or for electromagnetic waves having a certain range of wavelengths. Apertures 6 could be configured so as to provide, individually or in combination, preferential admittance for electromagnetic waves to propagate into and across conductive surface 1 in a certain pattern. Apertures 6 could be configured so as to produce, individually or in combination, a desired pattern of paths into and across conductive surface 1 for electromagnetic waves, perhaps for a predetermined range of wavelengths.

Such a pattern could be more advantageous than the long diagonal paths 21 and 22 shown in the prior art structures of FIGS. 1–2, which produce problems in the electrical performance of conductive surface 1, as discussed above. For example, appropriate configuring of apertures 6 and separators 7 could produce electromagnetic wave paths across conductive surface 1 resembling paths 23 as shown in FIG. 3. The dimensions and shapes and materials and disposition of the various apertures 6, and the dimensions and shapes and materials and disposition of the various separators 7 between them, and the dimensions and shapes and materials and disposition of the remaining portions of connecting structure 4, could relevantly affect the pattern of electromagnetic wave paths across conductive surface 1. This pattern of paths could be advantageously configured such that parallel paths such as paths 23 are formed, encouraged, or allowed—while other paths, such as diagonal paths 21,22 as shown in FIG. 2, are prevented, weakened, reduced, or discouraged, possibly via cancellation.

As an analogy, it is noted that single or plural apertures providing preferential admittance (such as holes or slits), appropriately configured in an opaque sheet, can, individually or in combination, cause light to propagate through such apertures so as to travel in or to form a predetermined pattern of paths on the far side of such apertures. By employing calculated nonuniformities, such as appropriate apertures appropriately disposed along an opaque sheet, the diffraction of light can be controlled to specific paths and patterns.

Paths 23 are advantageous over prior art paths 20,21,22 in being of uniform length; hence the temporal dispersion problems noted for prior art could be reduced by the structure of the present invention. Paths 23 are further advantageous over paths 21,22 in being shorter, and in not executing coil loop turns in the case where conductive surface 1 is rolled up; hence they could have lower self inductance, and also less disparity in self inductance, hence reduced temporal dispersion. Thus, paths 23 could provide improved electrical performance for conductive surface 1 over paths 20,21,22 of prior art structures.

Apertures 6 could provide preferential admittance, compared to other portions of nonuniform connecting structure 4, in a variety of ways. For example, apertures 6 might comprise an electrically conductive material, and might represent the only electrical connections from connecting structure 4 to conductive surface 1; separators 7 in between apertures 6 could comprise a dielectric, including possibly voids or air. Or, for example, apertures 6 and separators 7 might both comprise conductive materials. Apertures 6 might provide preferential admittance to conductive surface 1 by virtue of having higher conductance than separators 7 do (due perhaps to differences in conductivity and/or geometry); and/or by virtue of having a molecular or atomic structure more similar or complementary or with greater affinity to that of conductive surface 1 than separators 7 do; and/or by virtue of being shaped and/or dimensioned and/or disposed so as to provide more preferential admittance for a desired range of electromagnetic wavelengths than separators 7 do. Bridging element 8 could comprise the same material as apertures 6 comprise (see for example FIG. 3) and/or could comprise the same material as separators 7 comprise (see for example FIG. 5).

Figure 4:
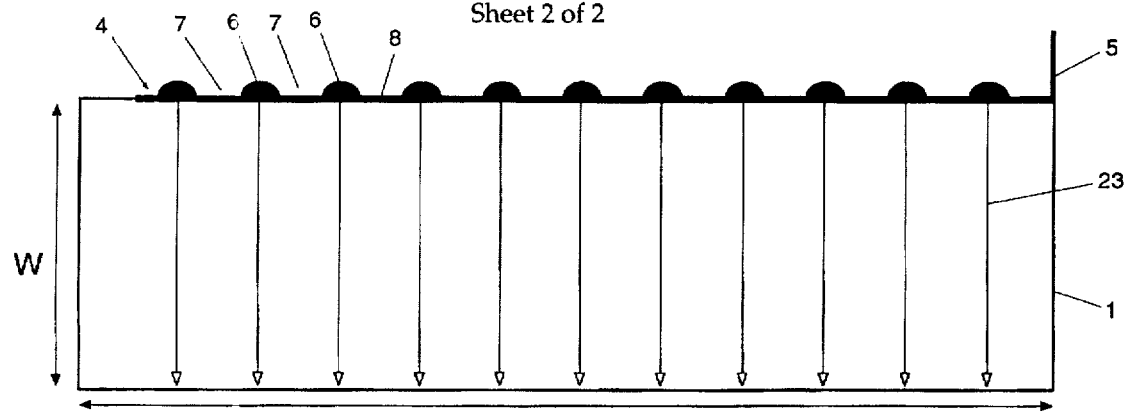

One possible embodiment of such alternatives is illustrated in FIG. 4, in plan view. FIG. 4 is similar to FIG. 3, except that connecting structure 4 is shown in a possible alternative configuration. The FIG. 4 embodiment illustrates that apertures 6 could be any shape, such as partially curved, instead of rectilinear as in FIG. 3. The shape of the curve could, for example, be parabolic, which might be advantageous to focus electromagnetic waves in parallel paths such as paths 23. The FIG. 4 embodiment further illustrates that connecting structure 4 could be uniform in its portion immediately adjacent to conductive surface 1, instead of nonuniform as in FIG. 3. Bridging element 8 could be adjacent to conductive surface 1, and/or more proximate to conductive surface 1 than apertures 6 are. Connecting structure 4, as shown in FIG. 4, is still nonuniform with respect to a dimension of conductive surface 1, here the dimension in the direction of length L, since apertures 6 alternate with separators 7 along this dimension, within the extent of connecting structure 4 along this dimension. The FIG. 4 embodiment further illustrates that separators 7 could comprise a void or air.

Figure 5:
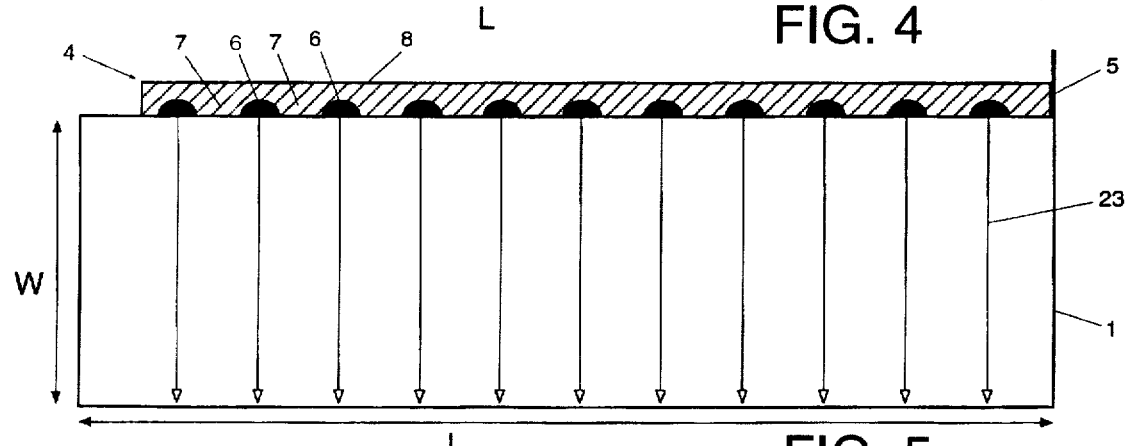

Another possible embodiment of such alternatives is illustrated in FIG. 5, in plan view. FIG. 5 illustrates that bridging element 8 could comprise the same material as separators 7 comprise, and that apertures 6 could comprise a different material. FIG. 5 further illustrates that apertures 6 could comprise a solid or liquid material (e.g. as a conductor), or alternatively (or additionally) apertures 6 could comprise a gas or void, for example in the form of dielectric cavities or holes; in such a form, apertures 6 might still be effective in determining the paths for electromagnetic waves across conductive surface 1, for example by virtue of the shape, dimensions, and/or disposition of apertures 6.

FIGS. 4 and 5 illustrate that connecting structure 4 could comprise a single material rather than plural materials, and further illustrate that the nonuniformity of connecting structure 4 within its extent could be due to its geometry, for example a variation of thickness along its length.

Figure 6:
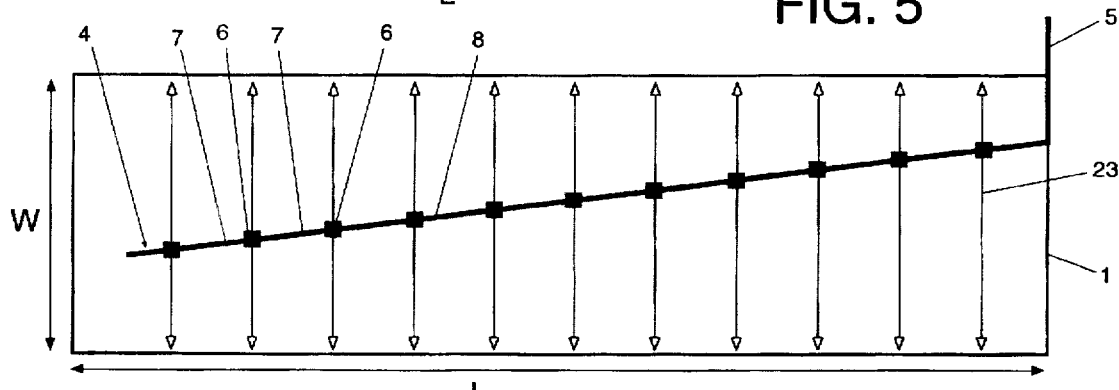

Another possible embodiment is illustrated in FIG. 6, in plan view. Connecting structure 4 in FIG. 6 could be similar to connecting structure 4 in FIG. 3, except that it is disposed differently relative to conductive surface 1. FIG. 6 illustrates that connecting structure 4 is not limited to being located along an edge of conductive surface 1, and also illustrates that connecting structure 4 (or its constituent parts) is not limited to being parallel to one of the dimensions of conductive surface 1, and thus is not limited to being parallel to conductive surface 1 itself. In the FIG. 6 example, the vector component of connecting structure 4's extent in direction L is shown as being greater than the vector component of its extent in direction W, so the former is the predominant vector component. Connecting structure 4 in FIG. 6 is in accordance with the present invention because there is a nonuniformity within the extent of connecting structure 4, with respect to this predominant vector component in direction L, namely the alternating of apertures 6 and separators 7.

As discussed above, connecting structure 4 could have a very small extent perpendicular to its predominant extent along conductive surface 1. Thus it could be arbitrarily narrow, and arbitraily narrower than conductive surface 1 (as also shown in FIGS. 3, 4, 6). Thus its constituent parts, such as bridging elements 8, could be arbitrarily narrow, in manners known to the art; for example bridging element 8 could take the form of very thin wires to feed the several apertures 6, such very thin wires having no substantial surface facing conductive surface 1 that is comparable in size to conductive surface 1.

Conductive surface 1 could be formed into any three dimensional shape, whereby at least one of its dimensions would become a curved line in space rather than a straight line, as would the direction following this dimension of conductive surface 1. Connecting structure 4 likewise could be formed into any three dimensional shape, whereby a vector component of its extension would extend along the direction of at least one dimension of conductive surface 1.

For example, if conductive surface 1 were rolled up into a spiral, perhaps to comprise a plate of a roll capacitor, then its dimension in flattened form corresponding to the length L direction would assume the form of a spiral in space, as would the length L direction for this conductive surface now formed into a three dimensional shape (the dimension in the width W direction of conductive surface 1 in flattened form might remain a straight line, and might become the length of the three dimensional cylinder representing the rolled up capacitor). Connecting structure 4 might then extend a substantial distance along this spiral length L direction, and it might have a predominant vector component in this spiral length L direction (as opposed to the width W direction, which represents the other dimension of conductive surface 1).

Figure 7:
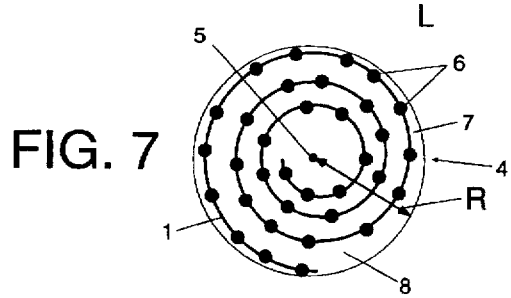
FIG. 7 shows an embodiment of a connecting structure in accordance with the present invention, in elevation end view.

One possible embodiment of the present invention for such a rolled up conductive surface 1 is illustrated in FIG. 7, in end view of the rolled up cylinder, showing conductive surface 1 edge on. In the FIG. 7 example as shown, the dimension of conductive surface 1 in the width W direction is orthogonal to the drawing, and the dimension of conductive surface 1 in the length L direction follows a spiral path as shown.

Connecting structure 4 in FIG. 7 could be configured similarly to connecting structure 4 as shown in FIG. 5. Apertures 6 could be adjacent to the foreground edge of conductive surface 1; apertures 6 might comprise specks of a first metal spray material, nonuniformly or noncontiguously distributed along the edge of conductive surface 1. Separators 7 and bridging element 8 might comprise a second metal spray material. This second metal spray material might be sprayed so as to cover apertures 6, while also filling in the spaces between apertures 6 and forming bridging element 8 connecting apertures 6; it might be sprayed so as to cover the end of the rolled up cylinder with a substantially uniform appearance. Bridging element 8 could connect to terminal 5. Connecting structure 4 could comprise apertures 6, separators 7, and bridging element 8.

Connecting structure 4 in this example would extend a substantial distance along the L direction of conductive surface 1, following this direction in its rolled up spiral form, and its predominant vector component would be in the length L direction of this dimension of conductive surface 1, as opposed to the width W direction of the other dimension of conductive surface 1. Connecting structure 4 would be nonuniform with respect to this predominant direction, since apertures 6 and separators 7 would alternate along this direction.

FIG. 7 demonstrates that connecting structure 4 can have any shape, not being confined to the substantially straight line shape shown in the previous drawings—as can the constituent parts of connecting structure 4, such as bridging elements 8. FIG. 7 further demonstrates that the various constituent parts of connecting structure 4 can be arranged in a wide variety of manners; for example, bridging elements 8 can radiate from a common terminal 5 to many apertures 6 which are arranged in patterns other than a straight line.

The spray method for the first spray material could be adjusted so as to advantageously configure apertures 6 and separators 7. For example, some spraying parameters could be adjusted so as to provide a predetermined average size (and possibly shape) for apertures 6 comprising specks of the first spray material, and some spraying parameters could be adjusted so as to provide a predetermined average spacing between specks of the first spray material, this spacing then being occupied by separators 7.

Radius R in FIG. 7 shows that the distance from terminal 5 to any point on the edge of conductive surface 1 is radius R or less, which is much shorter than the length L of conductive surface 1. It is noted that in FIG. 7, even if the extent of connecting structure 4 were regarded as merely radius R (or diameter 2R) rather than following the spiral length L, the predominant vector component of connecting structure 4's extent would still be in the general length L direction, of this dimension of conductive surface 1, as opposed to the direction of the other dimension of conductive surface 1, since this predominant vector component is greater than the vector component of connecting structure 4's extent in the width W direction of conductive surface 1. Thus, in accordance with the present invention, connecting structure 4 is nonuniform with respect to the dimension of conductive surface 1 in this length L direction, with apertures 6 and separators 7 alternating along this direction. In the case where connecting structure 4 comprises spray material, its extent in the general length L direction, or even just across diameter 2R, could likely be at least ten times greater than its extent in the perpendicular width W direction corresponding to the other dimension of conductive surface 1.

Apertures 6 might provide preferential admittance over separators 7 via a variety of techniques, for example by virtue of shape, dimensions, spacing, conductance, and/or molecular or atomic affinity for the material of conductive surface 1. Alternatively or additionally, separators 7 might provide inferior admittance compared to apertures 6 via a variety of techniques. For example, a hot second metal spray material might be employed to deliberately curl the edges of a plastic film adjacent to conductive surface 1 wherever this plastic film is not protected by instances of apertures 6 (e.g. specks of a cooler first metal spray); this curl could provide some insulation between bridging element 8 and conductive surface 1, at locations other than apertures 6, these instances of insulation thereby acting as separators 7.

The FIG. 7 example illustrates several significant improvements in electrical performance that could be provided by the present invention. Firstly, the longest path for an electromagnetic wave from terminal 5 through conductive surface 1 comprising this capacitor plate could be merely 1.5 inches in accordance with the present invention, including 1 inch for any path 23 (not shown; orthogonal to drawing) and 0.5 inches for the distance R from terminal 5 to the farthest path 23. This is much shorter than the longest path 21 of prior art as shown in FIG. 2, which could be over 2000 inches. Long paths can adversely affect delay characteristics imposed upon a signal.

Secondly, the self inductance of the longest path in the present invention could be based upon a length of 1.5 inches with no coil loop turns. The self inductance of the longest path 21 of prior art FIG. 2 could be based upon a length of over 2000 inches, multiplied by a factor of 1 million (representing 1000 coil loop turns squared). High self inductance can adversely affect electrical performance for high frequencies.

Thirdly, the disparity in path length, from the longest to the shortest path, could be a factor of merely 1.5 to 1 with the present invention, but could be over 2000 to 1 with paths 21 and 20 of prior art FIG. 2. Disadvantageous temporal smearing of a signal could be produced by such disparity in path lengths through a capacitor plate.

Fourthly, the disparity in self inductance, from the longest to the shortest path, could still be a factor of merely 1.5 to 1 with the present invention, since no coil loop turns are executed by paths 23. The disparity in self inductance between paths 21 and 20 of prior art FIG. 2 could be over 2000 to 1 multiplied by the coil loop turn factor of 1 million. Disadvantageous temporal dispersion of signals could be produced by such disparity in self inductance for the various paths through a capacitor plate.

Figure 8:
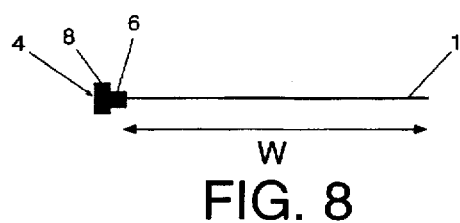
FIG. 8 shows an embodiment of a connecting structure in accordance with the present invention, in elevation end view.

A narrow area of prior art (Hamabe, Gizolme) has taught a capacitor with a segmented plate comprising many conductive surfaces, and has taught, in conjunction with such a segmented plate, a nonuniform connecting structure. The purpose and utility of such nonuniform connecting structures has been limited to acting as a fuse in the event of current overload. Thus, these nonuniform connecting structures have been limited to being employed in conjunction with a segmented plate, thus they have been limited to making connection to plural conductive surfaces. Furthermore, these connecting structures have been limited to being thinner than the conductive surface they feed, or no thicker than the conductive surface, so that a fusing break from current overload would occur in the connecting structure rather than in the conductive surface. In contrast, the nonuniform connecting structure of the present invention is not limited to a segmented plate, nor is it limited to making connection to plural conductive surfaces; it can provide advantageous improvements even with a single contiguous, non-segmented conductive surface or capacitor plate. In further contrast, the purpose and utility of the nonuniform connecting structure of the present invention can provide electrical performance improvements even in the absence of current overload. In further contrast, portions of the nonuniform connecting structure of the present invention could be thicker than the conductive surface it feeds, since no fusing utility to protect the conductive surface is required. FIG. 8 illustrates one example of the latter point.

FIG. 8 shows a possible embodiment of the present invention, in elevation view of one end of conductive surface 1, viewing the dimension of width W, with the dimension of length L being orthogonal to the drawing. The FIG. 8 embodiment could be similar to the FIG. 3 embodiment, but seen from a different view. As shown in FIG. 8, connecting structure 4 could be thicker than conductive surface 1. The dimension along which connecting structure 4 is nonuniform in FIG. 8 could be in the direction of length L of conductive surface 1, this direction being orthogonal to the drawing of FIG. 8. As shown in the FIG. 8 example, connecting structure 4 is thicker than conductive surface 1 in a second direction perpendicular to the direction of the nonuniformity of connecting structure 4.

In accordance with the present invention, the nonuniformity of connecting structure 4 could be a nonuniformity of material, and/or a nonuniformity of structural shape or dimension. The present invention is not limited to any particular materials or combination of materials, and is not limited to any particular shape or dimensions, for the nonuniform connecting structure taught by the present invention.

Conductive surface 1 could have any shape or dimensions. It could be a conductive surface of, upon, or within a solid object or a three dimensional object. For example, conductive surface 1 could comprise the conductive surface of a solid conductor, or a conductive surface of, upon, or within a cable or printed circuit board comprising dielectric materials as well as conductive materials.

Any definitions or criteria given in this specification possible illustrative examples, contributing to the description of some possible embodiments of the present invention. These definitions and criteria do not delimit the present invention, either inclusively or exclusively.

Although the present invention has been described in considerable detail in the above specification, it is not intended that the invention be limited to such detail except as necessitated by the appended claims or their legal equivalent.

I claim:

1. A method for providing improved electrical performance from a single electrically conductive surface,
    said method comprising the step of providing a single electrically conductive surface,
    and the step of providing a substructure for making external electrical connection to said single surface,
    and the step of electrically connecting said substructure to said single surface at substantially more than one point, said connecting being substantially nonuniform with respect to a dimension of said single surface in a first direction.

2. The method of claim 1 wherein said substructure is substantially nonuniform along at least one of its extents.

3. The method of claim 1 whereby improved control can be provided of paths taken by electromagnetic waves across a dimension of said single surface.

4. The method of claim 1 wherein said substructure comprises a sprayed material disposed nonuniformly with respect to said dimension of said single surface in said first direction.

5. The method of claim 1 wherein said substructure is thicker than said single surface, in a second direction substantially perpendicular to said first direction.

6. The method of claim 1 wherein a first extent, of said substructure in a third direction, said third direction possibly being coincident with said first direction, said substructure being nonuniform along said first extent, is at least ten times greater than a second extent of said substructure in a fourth direction, said fourth direction being substantially perpendicular to said third direction and substantially parallel to said single surface.

7. The method of claim 1 wherein said single surface is formed into a three dimensional shape.

8. The method of claim 1 wherein said substructure is formed into a three dimensional shape.

9. A method for making external electrical connection to a single electrically conductive surface,
    said method comprising the step of providing a substructure for making external electrical connection to said single surface,
    said substructure extending along a first extent greater than substantially one point,
    and the step of making a predominant vector component of said first extent extend along a dimension of said single surface in a first direction,
    and the step of providing that said substructure is substantially nonuniform, within said first extent,
    and the step of electrically connecting said substructure to said single surface at substantially more than one point.

10. The method of claim 9 wherein said connecting is substantially nonuniform with respect to a dimension of said single surface.

11. The method of claim 9 wherein said substructure is substantially nonuniform, within said first extent, with respect to said dimension of said single surface in said first direction.

12. The method of claim 9 whereby improved control can be provided of paths taken by electromagnetic waves across a dimension of said single surface.

13. The method of claim 9 wherein said substructure comprises a sprayed material disposed nonuniformly with respect to said dimension of said single surface in said first direction.

14. The method of claim 9 wherein said substructure is thicker than said single surface, in a second direction substantially perpendicular to said first direction.

15. The method of claim 9 wherein a second extent, of said substructure in a third direction, said third direction possibly being coincident with said first direction, said substructure being nonuniform along said second extent, is at least ten times greater than a third extent of said substructure in a fourth direction, said fourth direction being substantially perpendicular to said third direction and substantially parallel to said single surface.

16. The method of claim 9 wherein an element selected from the group, consisting of said single surface and said substructure, is formed into a three dimensional shape.

* * * * *